(12) United States Patent
Tanaka

(10) Patent No.: US 7,189,599 B2
(45) Date of Patent: Mar. 13, 2007

(54) LEAD FRAME, SEMICONDUCTOR DEVICE USING THE SAME AND METHOD OF PRODUCING THE SEMICONDUCTOR DEVICE

(75) Inventor: Takekazu Tanaka, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 188 days.

(21) Appl. No.: 10/936,795

(22) Filed: Sep. 9, 2004

(65) Prior Publication Data

US 2005/0032271 A1 Feb. 10, 2005

Related U.S. Application Data

(62) Division of application No. 10/156,812, filed on May 30, 2002, now abandoned.

(30) Foreign Application Priority Data

May 30, 2001 (JP) .............................. 2001-163268

(51) Int. Cl.
*H01L 21/00* (2006.01)
*H01L 23/495* (2006.01)

(52) U.S. Cl. ...................... 438/123; 438/111; 438/977; 257/666

(58) Field of Classification Search ................ 438/106, 438/111, 123, 691, 692, 693, 15, 25; 257/666
See application file for complete search history.

(56) References Cited

U.S. PATENT DOCUMENTS

| | | | |
|---|---|---|---|
| 5,424,254 A * | 6/1995 | Damiot | 438/106 |
| 6,163,069 A | 12/2000 | Oohira et al. | |
| 6,238,952 B1 * | 5/2001 | Lin | 438/110 |
| 6,368,886 B1 * | 4/2002 | Van Broekhoven et al. | 438/15 |
| 6,451,627 B1 * | 9/2002 | Coffman | 438/111 |
| 6,455,348 B1 * | 9/2002 | Yamaguchi | 438/106 |
| 6,528,879 B2 | 3/2003 | Sakamoto et al. | |
| 6,800,508 B2 * | 10/2004 | Kimura | 438/123 |
| 6,946,324 B1 * | 9/2005 | McLellan et al. | 438/111 |
| RE38,961 E * | 1/2006 | Okuno et al. | 438/108 |
| 2002/0180011 A1 | 12/2002 | Tanaka | |
| 2003/0082854 A1 * | 5/2003 | Kasahara et al. | 438/123 |
| 2003/0160339 A1 | 8/2003 | Ikegami et al. | |
| 2004/0063252 A1 * | 4/2004 | Takahashi | 438/123 |

FOREIGN PATENT DOCUMENTS

| | | | |
|---|---|---|---|
| JP | 59-208755 | * | 11/1984 |
| JP | 03-188657 | * | 8/1991 |
| JP | 12-150707 | | 5/2000 |
| JP | 13-028420 | | 1/2001 |

* cited by examiner

*Primary Examiner*—Carl Whitehead, Jr.
*Assistant Examiner*—James M. Mitchell
(74) *Attorney, Agent, or Firm*—Young & Thompson

(57) ABSTRACT

A lead frame of the present invention includes a pair of base portions having a substantially flat bottom each. An island portion and electrode portions are partly connected to the tops of the base portions. The lead frame needs a minimum of production cost and promotes dense mounting of semiconductor devices to a circuit board.

5 Claims, 21 Drawing Sheets

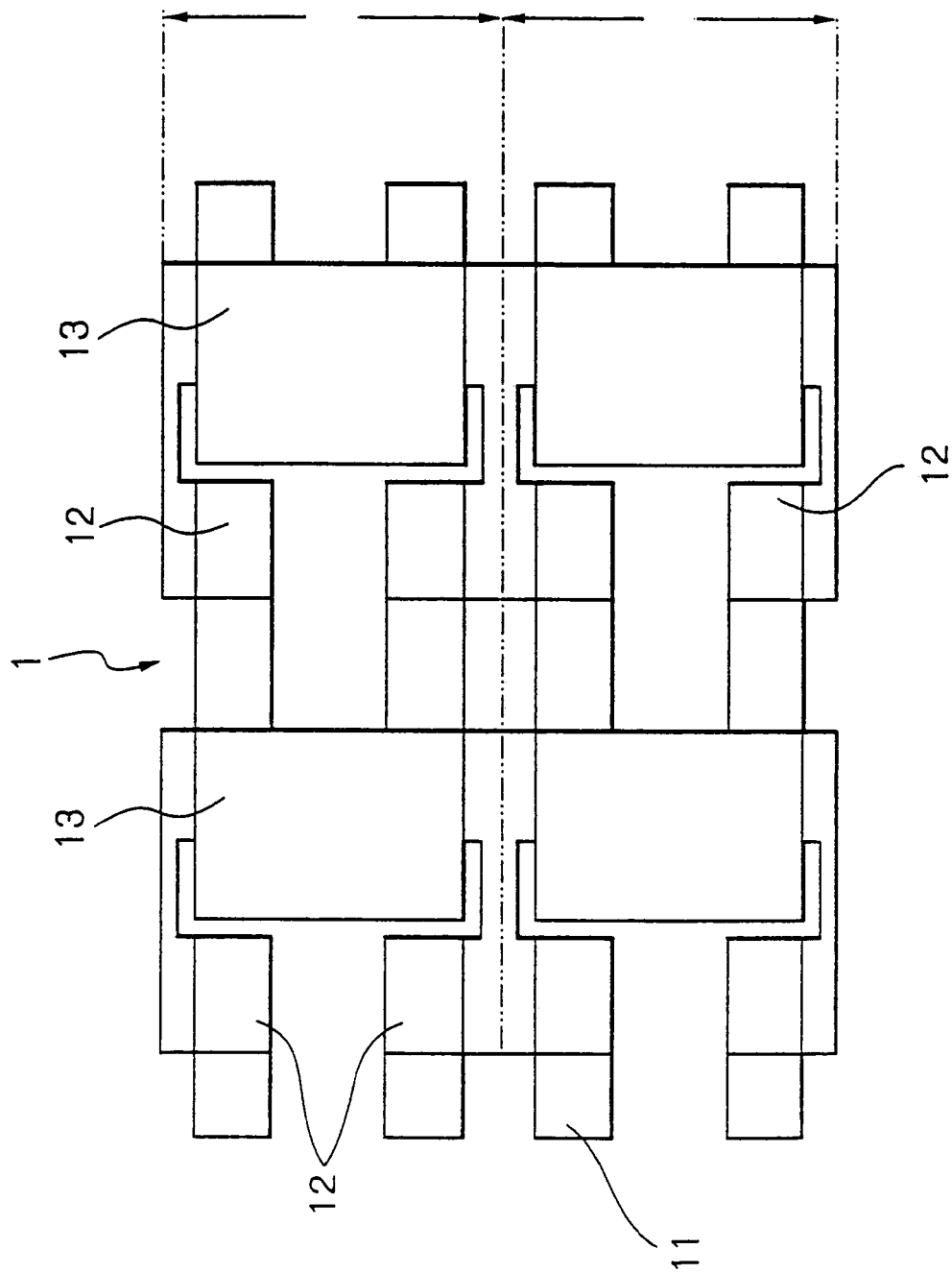

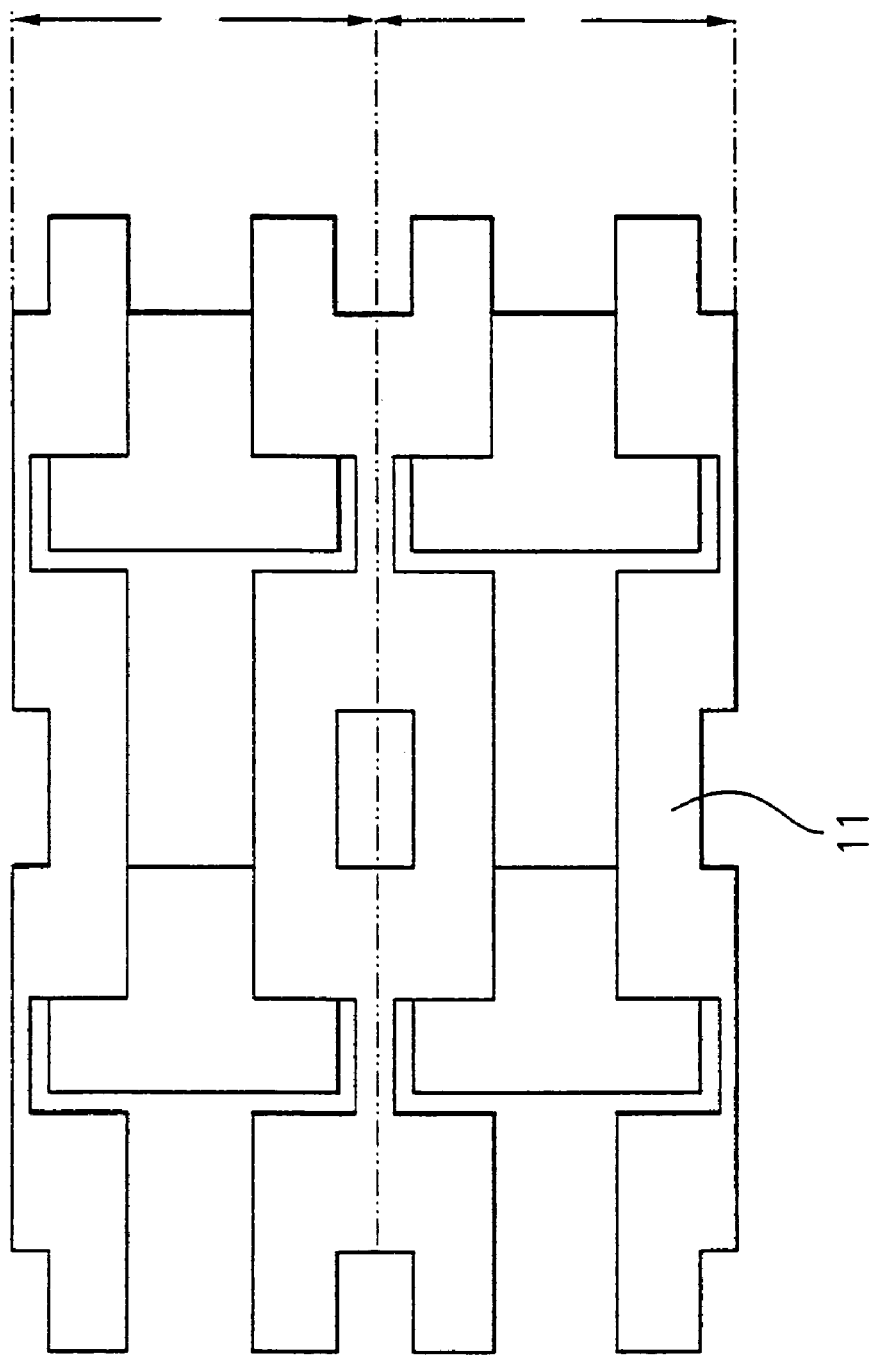

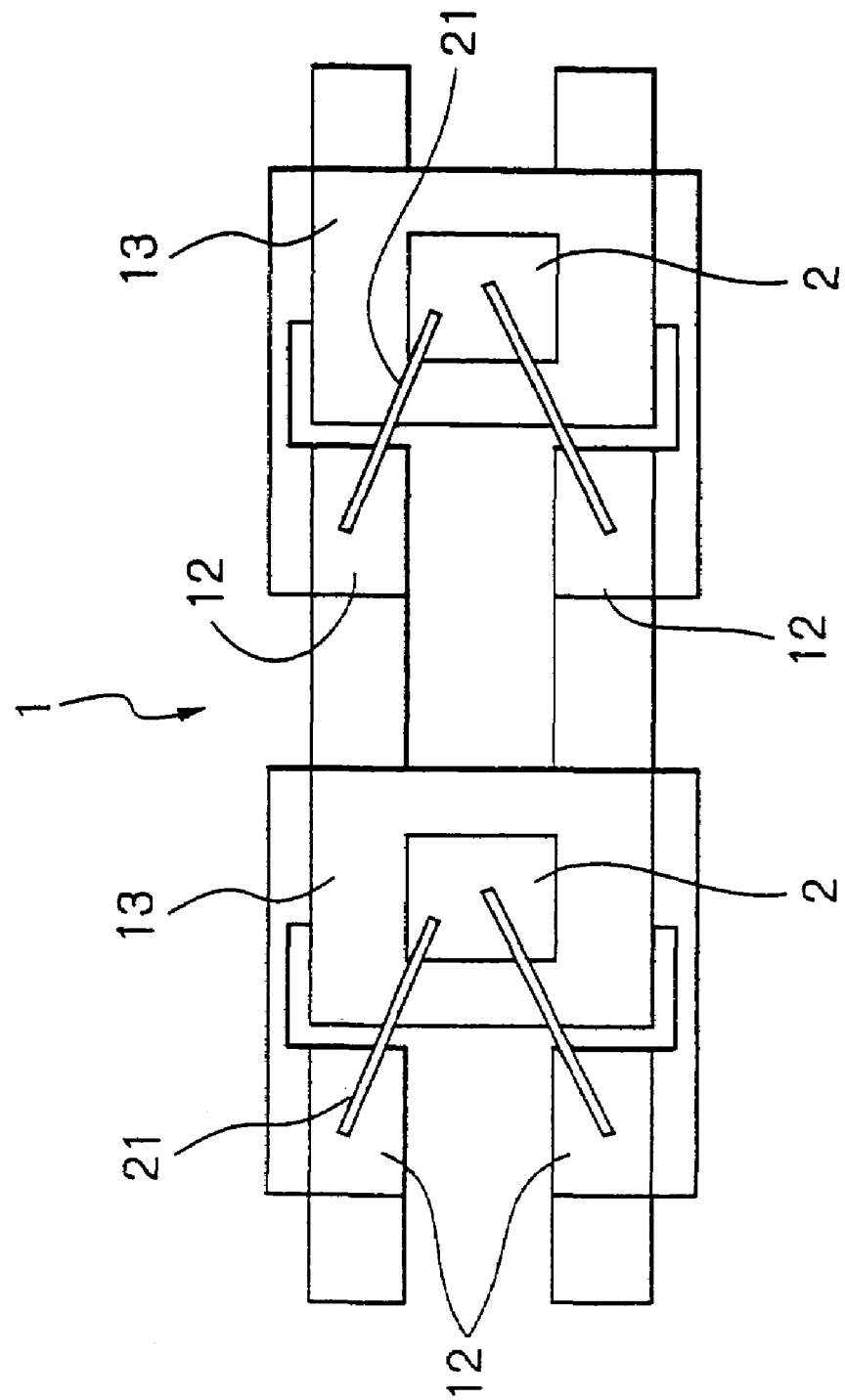

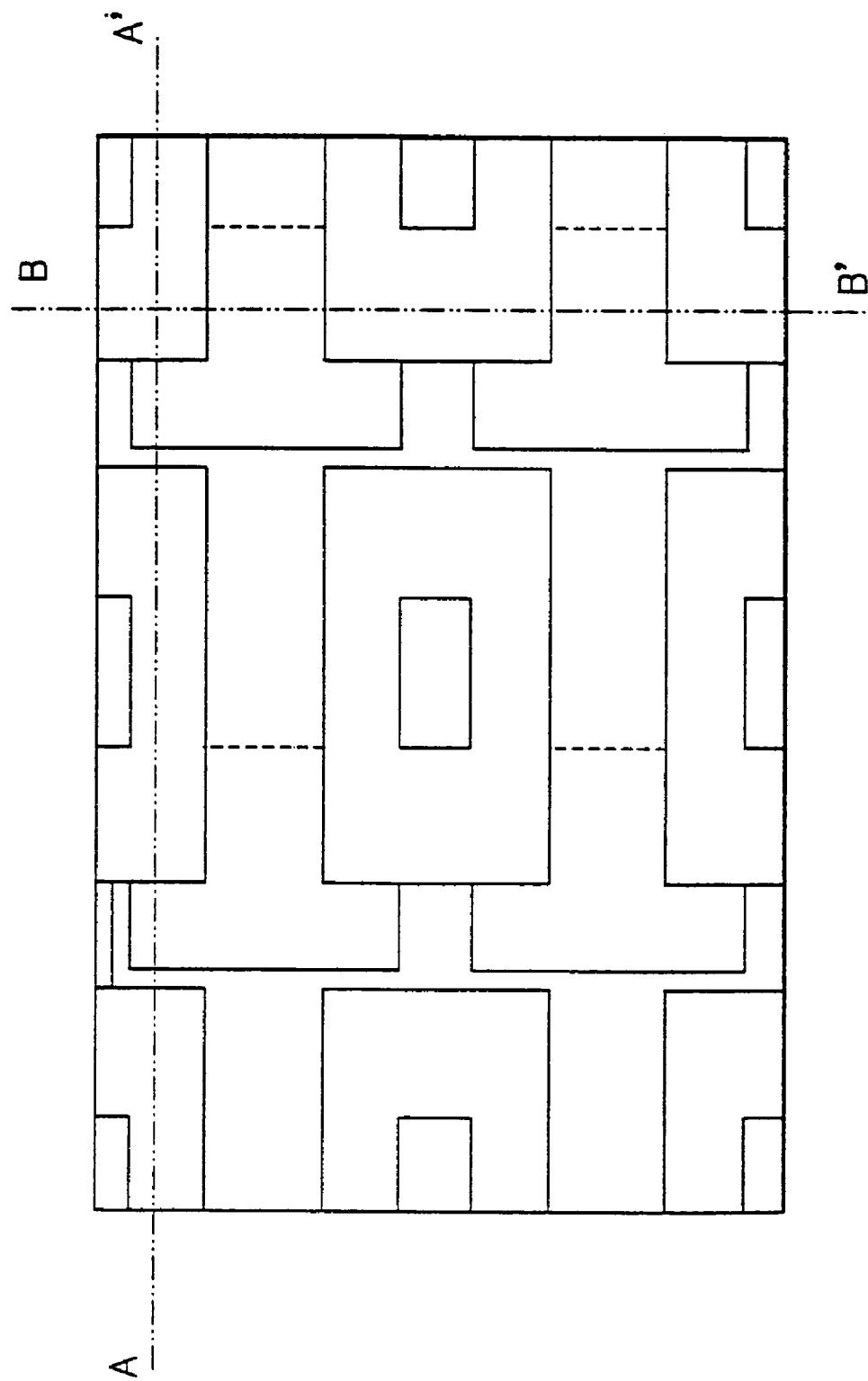

PLATING

LEAD FRAME, SEMICONDUCTOR DEVICE USING THE SAME AND METHOD OF PRODUCING THE SEMICONDUCTOR DEVICE

CROSS REFERENCE TO RELATED APPLICATIONS

This application is a division of application Ser. No. 10/156,812, filed on May 30, 2002, now abandoned the entire contents of which are hereby incorporated by reference.

BACKGROUND OF THE INVENTION

1. Field of the Invention

The present invention relates to a lead frame, a semiconductor device using the same, and a method of producing the semiconductor device.

2. Description of the Background Art

There is an increasing demand for the miniaturization of semiconductor devices that implements dense mounting of semiconductor devices to a circuit board. To reduce the size of a semiconductor device, a QFN (Quad Flat Non-leaded Package), a SON (Small Outline Non-leaded Packages) and other so-called non-leaded packages are often used. While a non-leaded package, like a conventional semiconductor device, uses a lead frame, it causes the lead frame to protrude from the bottom of a semiconductor package for thereby reducing the mounting area.

The non-leaded package that makes outside electrodes not visible from above a circuit board is desirable. However, when the lead frame is required to protrude from the side of a semiconductor package, the degree of projection should be reduced as far as possible.

It is a common practice with a semiconductor device using a non-leaded package to protect external electrodes with a resin sheet during production. More specifically, the resin sheet prevents resin from leaking at the time when the resin seals a lead frame loaded with a semiconductor chip and undergone wire bonding, thereby insuring plating to follow. Therefore, the resin sheet is not a structural element of a semiconductor device or product. Because the resin sheet is expensive, it increases the production cost of the semiconductor device and thereby makes the demand for cost reduction more keen.

Moreover, in a conventional semiconductor device, part of a lead frame constituting electrode portions appear on the side of a package. It follows that when semiconductor devices are mounted to a circuit board side by side, it is necessary to guarantee a space broad enough to avoid short-circuiting ascribable to, e.g., soldering between nearby semiconductor devices. This obstructs dense mounting of semiconductor devices to a circuit board.

SUMMARY OF THE INVENTION

It is an object of the present invention to provide a lead frame realizing noticeable cost reduction and dense mounting, a semiconductor device using the same, and a method of producing the semiconductor device.

In accordance with the present invention, a lead frame of the present invention includes a base portion having a substantially flat bottom, and an island portion and an electrode portion partly formed integrally with the top of the base portion.

Also, in accordance with the present invention, a semiconductor device includes an island portion on which a semiconductor chip is mounted, and electrode portions connected to electrodes formed on the surface of the semiconductor chip by bonding wires. The island portion and electrode portions are sealed with seal resin while partly protruding from the bottom of the seal resin each.

Further, in accordance with the present invention, a method of producing a semiconductor device for causing the surface of a lead frame to partly appear on the bottom of the semiconductor device begins with a step of mounting a semiconductor chip to an island portion included in the lead frame. Electrodes formed on the surface of the semiconductor chip and an electrode portion are connected by bonding wires. Part of the top and part of the bottom of the lead frame, which include the island portion, semiconductor chip, electrode portion and bonding wire, are sealed with seal resin. Subsequently, the entire surface of the seal resin beneath the lead frame is ground in parallel to the bottom of the lead frame. Finally, part of the bottom of the lead frame is caused to appear on the bottom of the seal resin.

BRIEF DESCRIPTION OF THE DRAWINGS

The above and other objects, features and advantages of the present invention will become more apparent from the following detailed description taken with the accompanying drawings in which:

FIGS. 4A through 4D, 5A through 5C, 6A through 6D, 7A through 7C, 8A through 8C, 9A through 9C, 10A through 10C and 10A through 11D are views showing a specific procedure for producing a semiconductor device using the lead frame of FIGS. 3A and 3B.

DESCRIPTION OF THE PREFERRED EMBODIMENT

Figure 1:
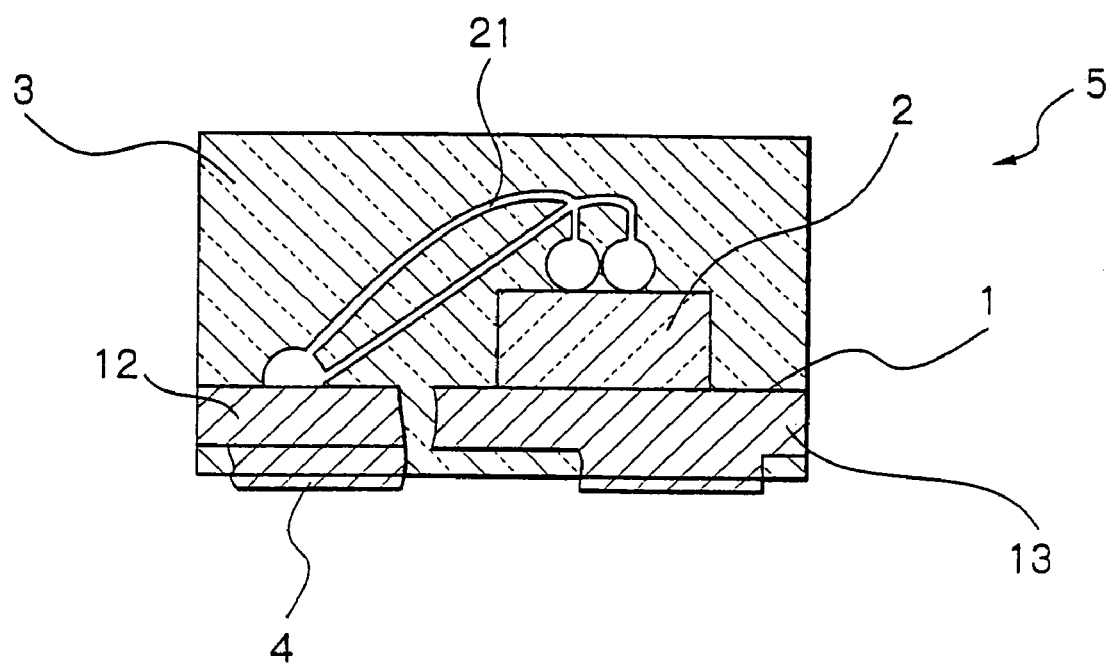
FIG. 1 is a section showing a conventional lead frame and a semiconductor device using the same.

To better understand the present invention, a conventional semiconductor device using a lead frame and a method off producing the same will be described. FIG. 1 shows a conventional semiconductor device 5 with a non-leaded package configuration. As shown, the semiconductor device 5 includes an island 13 and an electrode portion 12 constituting a lead frame 1. The island 13 and electrode portion 12 each are partly exposed to the outside of seal resin 3, forming an external electrode 4. A semiconductor chip 2 is mounted on the top of the island 13 via a bond implemented by, e.g., a silver paste or Au—Si cutectic crystal. The semiconductor chip 2 is sealed by the seal resin 3 together with the lead frame 1.

Gold wires or similar bonding wires 21 connect electrodes arranged on the top of the semiconductor chip 2 and the lead frame, which form the electrode portion 12. The term "top" refers to the surface of the semiconductor device 5 sealed with the seal resin 3 facing upward. Likewise, a term "bottom" to appear later refers to the surface of the semiconductor device 5 where the external electrodes 4 are exposed to the outside or facing the surface of a circuit board, not shown, when the semiconductor device 5 is mounted to the circuit board.

The external electrodes 4 are positioned on the bottom of the island 13 and that of the electrode portion 12, as stated above. The island 13 and electrode portion 12 therefore protrude to the outside of the package.

Figure 2A:
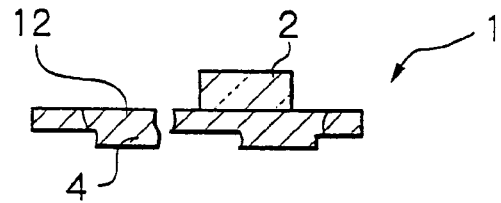
FIGS. 2A through 2F are sections demonstrating a sequence of steps for producing the conventional semiconductor device.
Figure 2B:
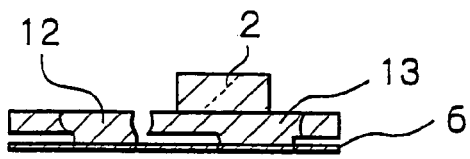
Figure 2C:
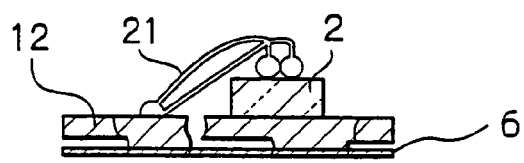

A method of producing the semiconductor device 5 shown in FIG. 1 will be described with reference to FIGS. 2A through 2F. First, as shown in FIG. 2A, the lead frame 1 including the island 13 and electrode portion 12 is fixed in place with its portions expected to form the external electrodes 4 facing downward. The semiconductor chip 2 is then mounted to the top of the island 13 via the previously mentioned bond. As shown in FIG. 2B, a resin sheet 6 is adhered to the bottom of the external electrodes 4. This may be done by positioning the resin sheet such that its adhesive surface faces upward, then adhering the lead frame 1 to the resin sheet 6 such that the adhesive surface and the bottoms of the external electrodes 4 face each other, and then mounting the semiconductor chip 2 to the top of the island 13 via the bond. Subsequently, as shown in FIG. 2C, the electrodes on the top of the semiconductor chip 2 and the top of the electrode portion 12 are interconnected by the bonding wires 21.

Figure 2D:
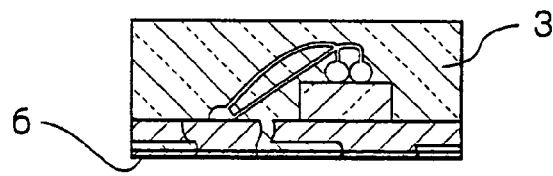
Figure 2E:
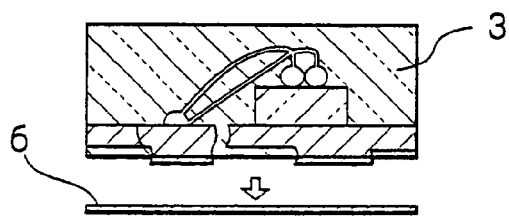
Figure 2F:
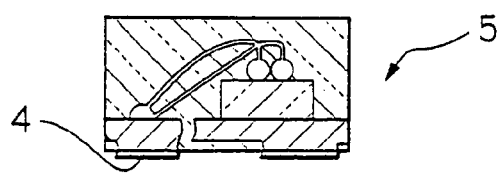

As shown in FIG. 2D, after the wire bonding step, the lead frame 1 positioned on the resin sheet 6 is sealed by the seal resin 3 together with the semiconductor chip 2. At this instant, the resin sheet 6 prevents the seal resin 3 from leaking to the bottoms of the external electrodes 4. Subsequently, as shown in FIG. 2E, the resin sheet 6 is peeled off the package. Finally, as shown in FIG. 2F, the bottom of the packages is plated except for the portions where the external electrodes 4 protrude downward. This is followed by dicing the seal resin 3 and lead frame 1 to thereby complete the semiconductor device 5.

The resin sheet 6 protects the external electrodes 4 during the production of the semiconductor device 5, as stated above. More specifically, when the lead frame 1 loaded with the semiconductor chip 2 is sealed with the seal resin 3, the resin sheet 6 prevents the resin 3 from leaking to thereby insure the plating step. However, the resin sheet 6 is expensive and increases the production cost of the semiconductor device 5.

Figure 3A:
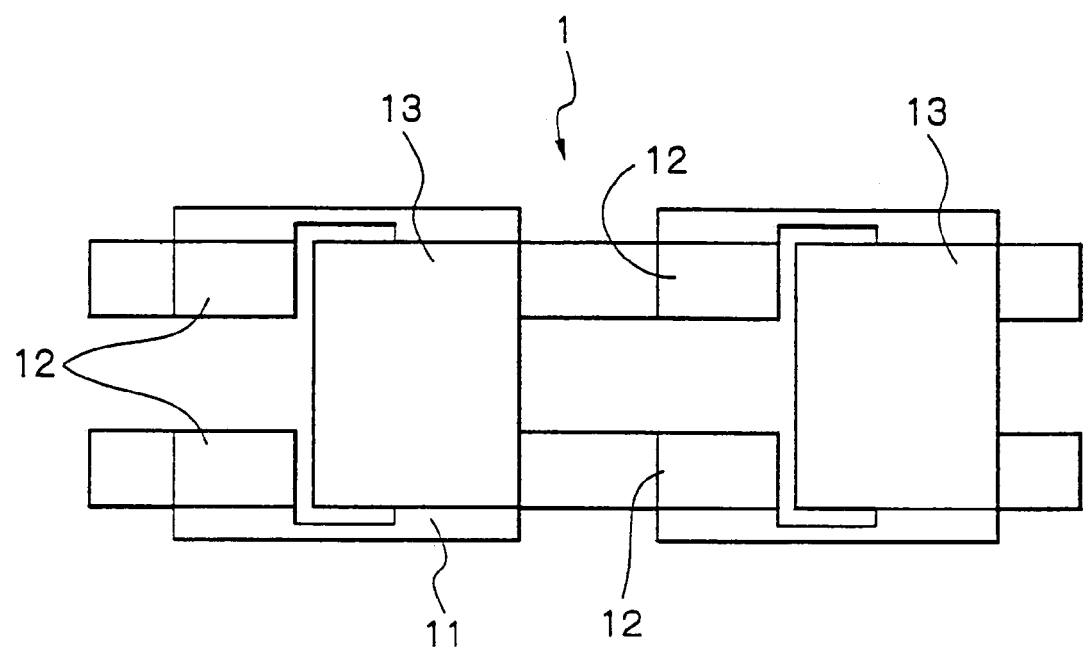
FIGS. 3A and 3B are views showing a lead frame embodying the present invention.
Figure 3B:
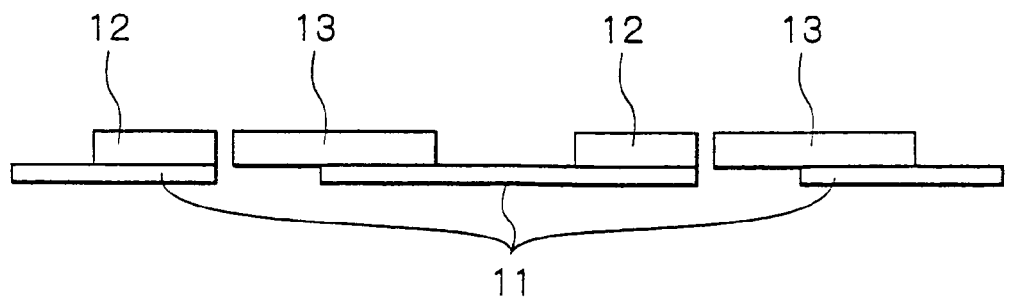
Figure 4C:
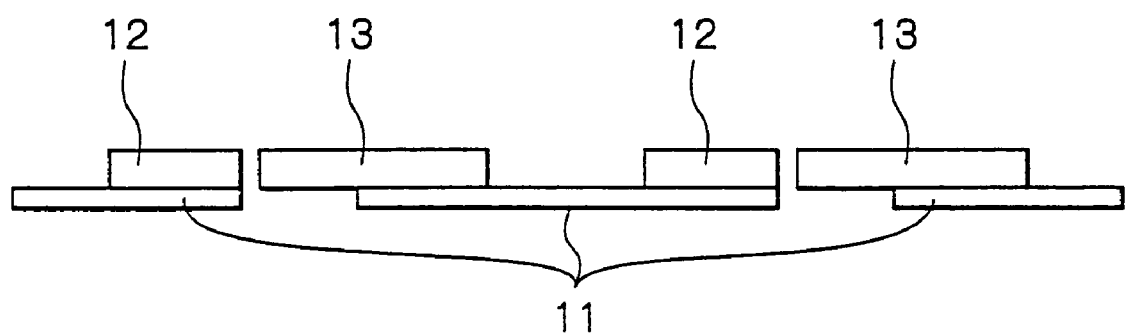
Figure 4D:
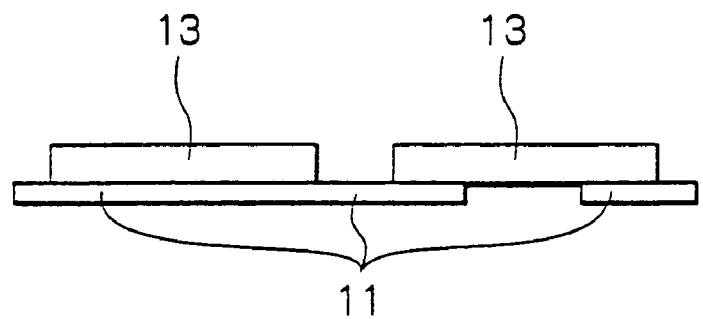

Referring to FIGS. 3A and 3B, a lead frame embodying the present invention will be described. FIGS. 3A and 3B are respectively a top view and a side elevation showing a unit lead frame 1 unique to the illustrative embodiment. Terms "top" and "bottom" to appear in the following description refer to a surface facing a circuit board on which the lead frame and a semiconductor device using the same are to be mounted and a surface opposite to the above surface.

As shown in FIGS. 3A and 3B, the lead frame includes a pair of base portions 11 and two island portions 13 extending over both of the two base portions 11. The lead frame 1 is formed of metal. Electrode portions 12 are formed on the base portions 11. More specifically, the electrode portions 12 and island portions 13 should preferably be formed on the tops of the base portions 11 integrally with the base portions 11.

In the lead frame 1 shown in FIG. 3A, one semiconductor chip, not shown, is to be mounted on each of the island portions 13. Usually, therefore, the lead frame 1 is configured to produce two semiconductor devices at the same time. More specifically, the base portions 11 protrude to the outside of the lead frame 1. Therefore, as shown in FIG. 3B, the electrode portions 12 and island portions 13 each is generally L-shaped in side elevation or section.

While in FIGS. 3A and 3B the island portions 13 each are shown as protruding from the base portions 11, or overhanging, with their bottoms being exposed, such a configuration is only illustrative. The crux is that the tops of the base portions 11 appear between the outside of the lead frame 1 and the island portions 13 as well as between the outside of the lead frame 1 and the electrode portions 12. The term "outside" refers to the direction of the end of the lead frame expected to form a single semiconductor package, i.e., the end that may form the surface of a semiconductor package with respect to a lead frame to be sealed.

Reference will be made to FIGS. 4 through 11 for describing a specific procedure for producing a semiconductor device using the lead frame 1. FIG. 4A shows two lead frames 1 each having the configuration shown in FIG. 3A positioned side by side at opposite sides of the pair of base portions 11. FIG. 4B is a bottom view while FIGS. 4C and 4D are side elevations. As shown in FIG. 4A, the specific procedure produces semiconductor devices by dealing with the lead frame 1 of FIG. 3A as a unit.

Figure 5B:
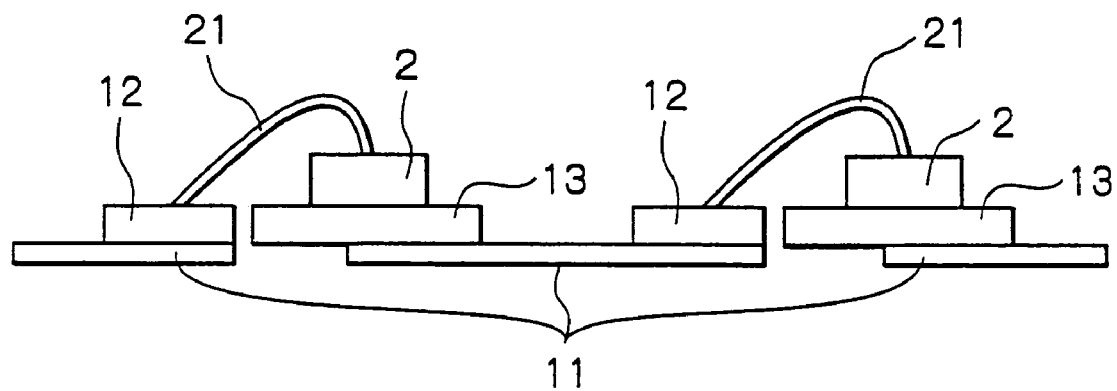
Figure 5C:
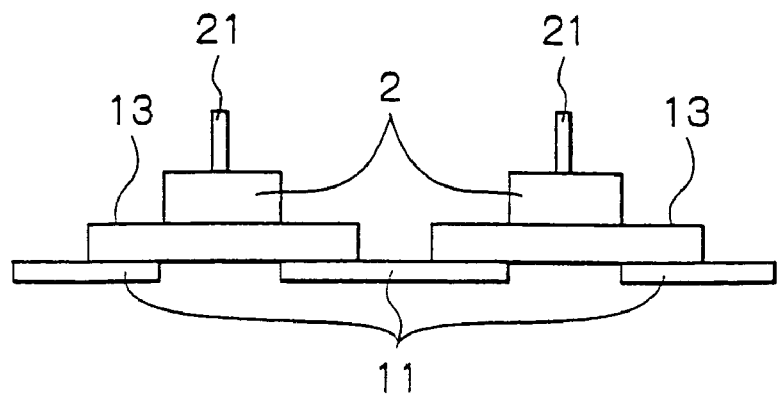
Figure 6A:
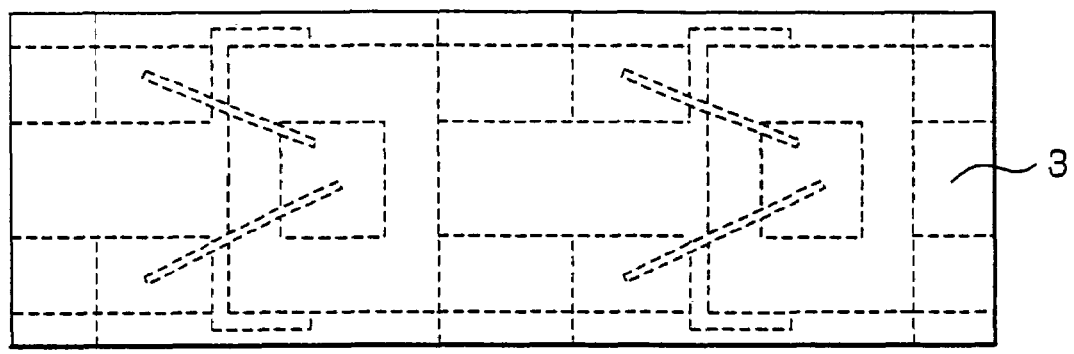
Figure 6B:
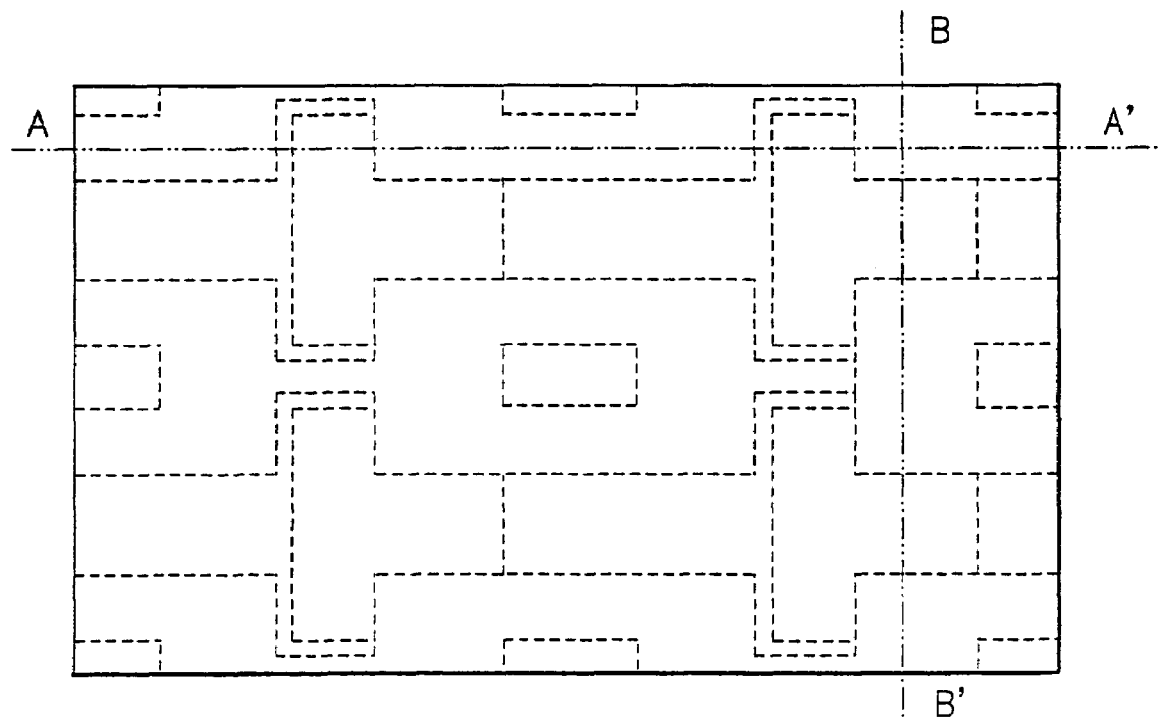
Figure 6C:
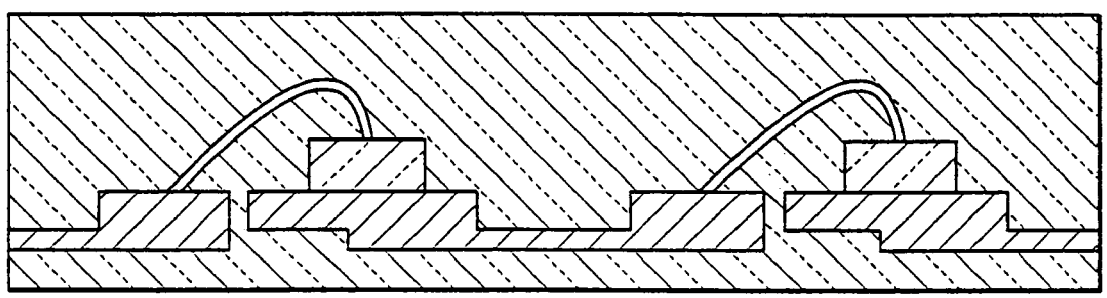
Figure 6D:
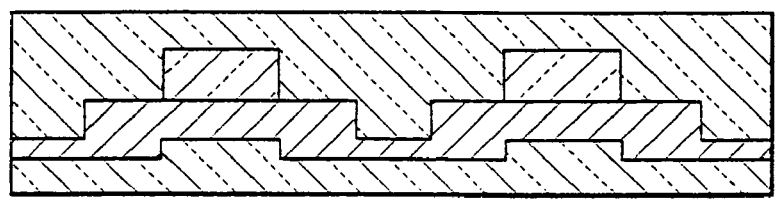

First, as shown in FIGS. 5A through 5C, one semiconductor chip 2 is mounted to each island portion 13 with the intermediary of silver paste, Au—Si cutectic crystal or similar bond. Subsequently, electrodes formed on the surface of the semiconductor chip 2 and the electrode portions 12 of the lead frame 1 are connected by bonding wires.

As shown in FIGS. 6A through 6D, the lead frame 1 loaded with the semiconductor chips 2, as stated above, is sealed with seal resin 3. One of characteristic features of the procedure of the present invention is sealing the entire lead frame inclusive of its bottom with the seal resin 3.

Figure 7A:
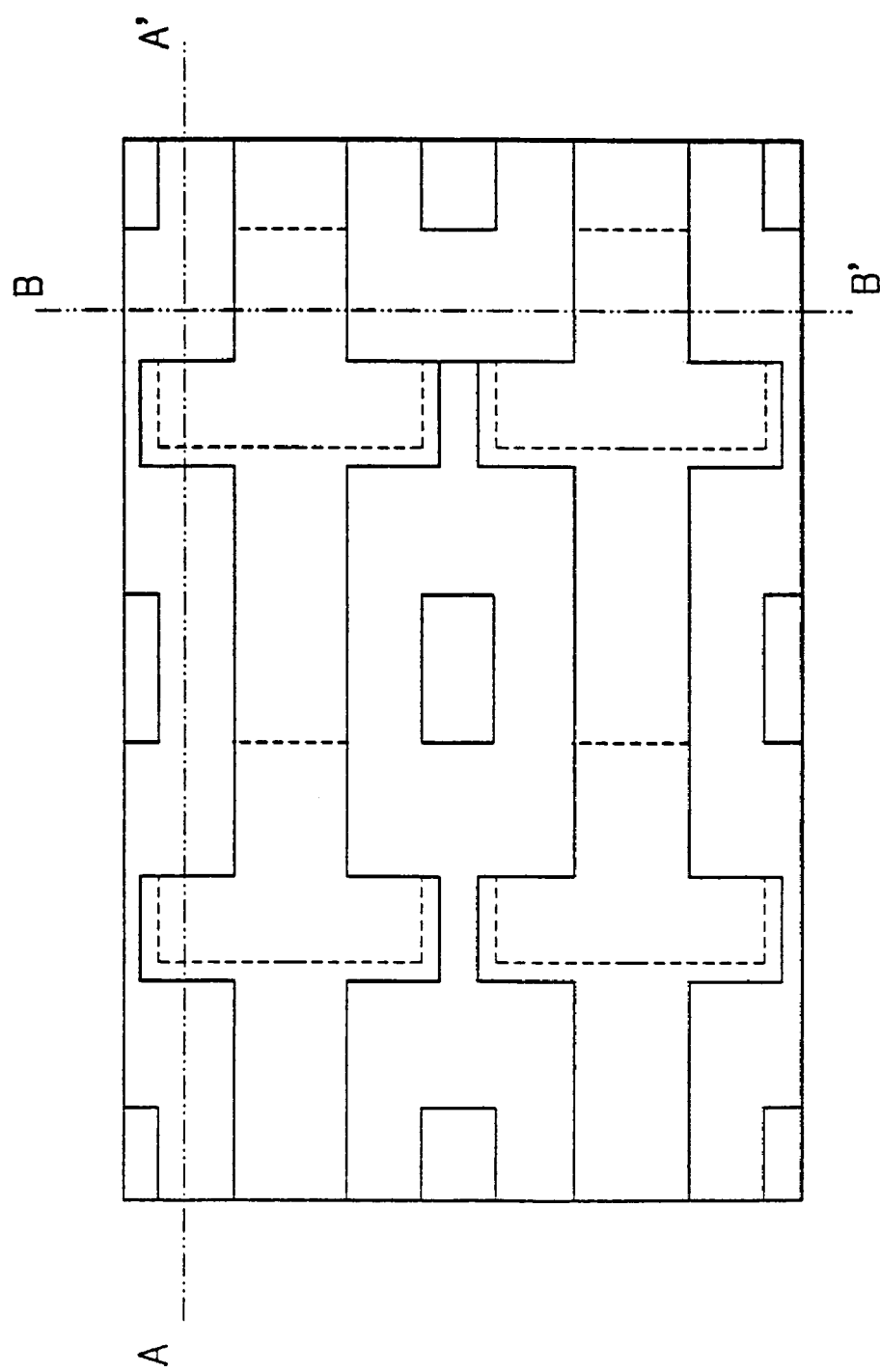
Figure 7B:
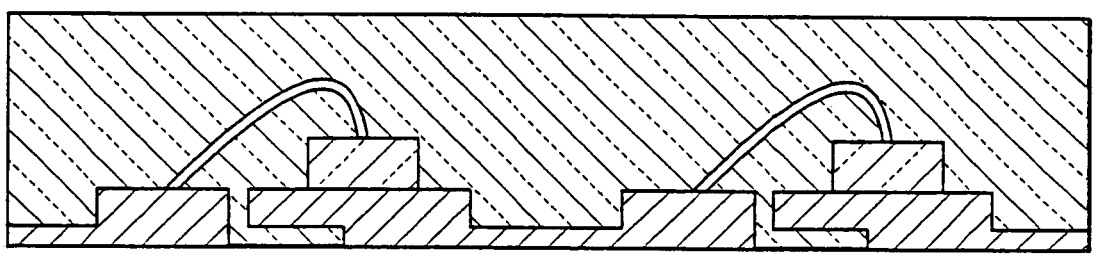
Figure 7C:
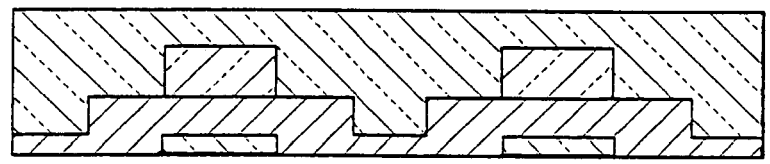
Figure 8A:
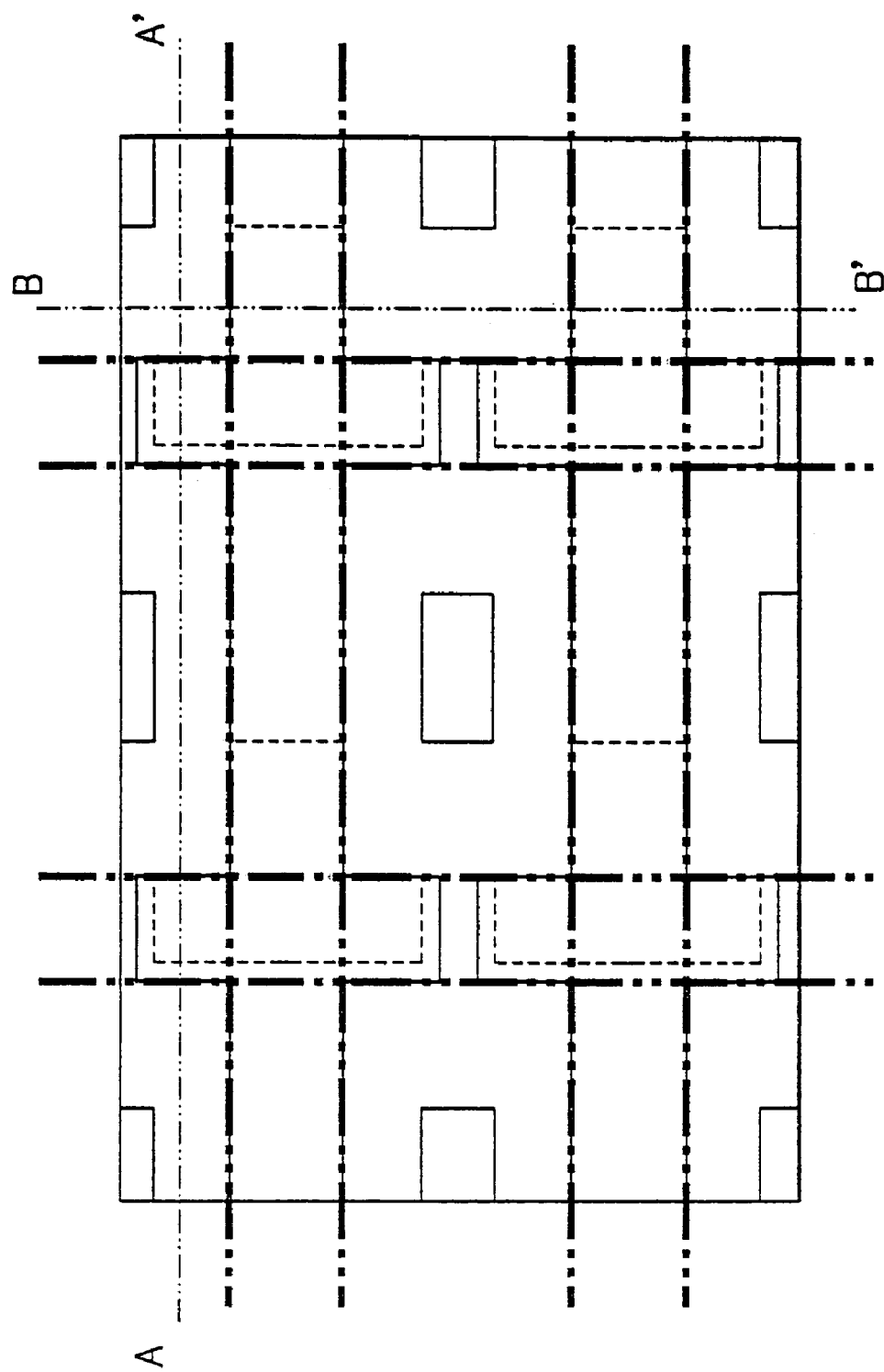
Figure 8B:
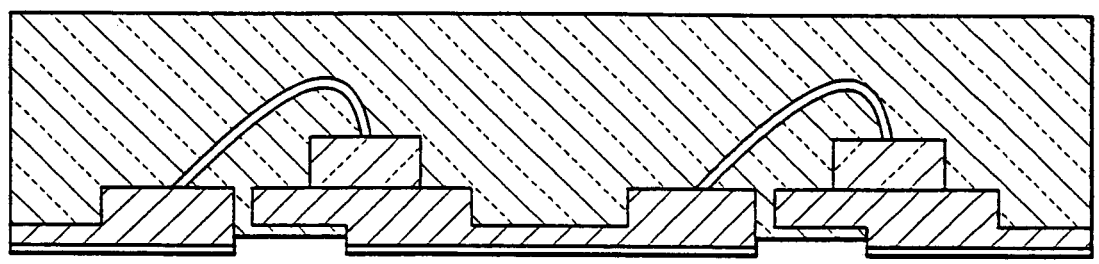
Figure 8C:
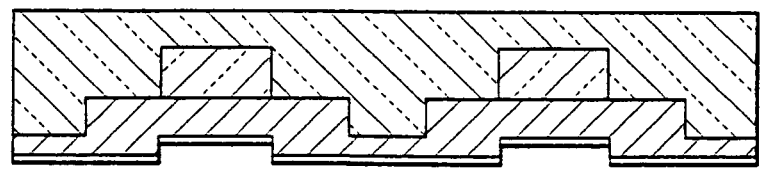

As shown in FIGS. 7A through 7C, the lead frame 1 entirely sealed with the seal resin 3 (semiconductor package hereinafter) is ground from the bottom. Grinding ends when the lead frame 1 has been exposed to the outside. Subsequently, the semiconductor package is diced by half-cut dicing over its regions indicated by bold dash-and-dots lines in FIG. 8A. FIGS. 8B and 8C are sections along lines A–A' and B–B', respectively, of FIG. 8A, showing the diced semiconductor package. As shown in FIG. 8B, the seal resin 3 on the bottom of the package is diced such that it protects the bottoms of the island portions 13. Also, as shown in FIG. 8C, the island portions 13 are configured to connect the pair of base portions 11, so that the seal resin 3 is diced in such a manner as to protect the bottoms of the island portions 13 as in FIG. 8B.

Figure 9B:
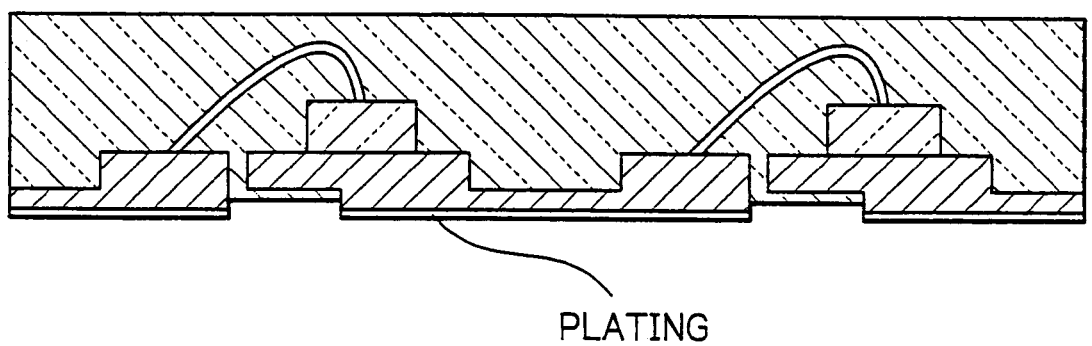
Figure 9C:
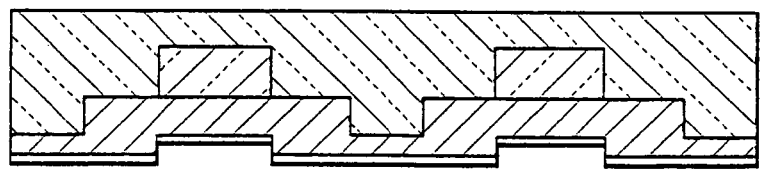

As shown in FIG. 9A, the surfaces of the base portions 11 exposed on the bottom of the package by the half-cut dicing step are plated. At this instant, as shown in FIGS. 9B and 9C, the bottoms of the island portions 13 are not plated.

Figure 10A:
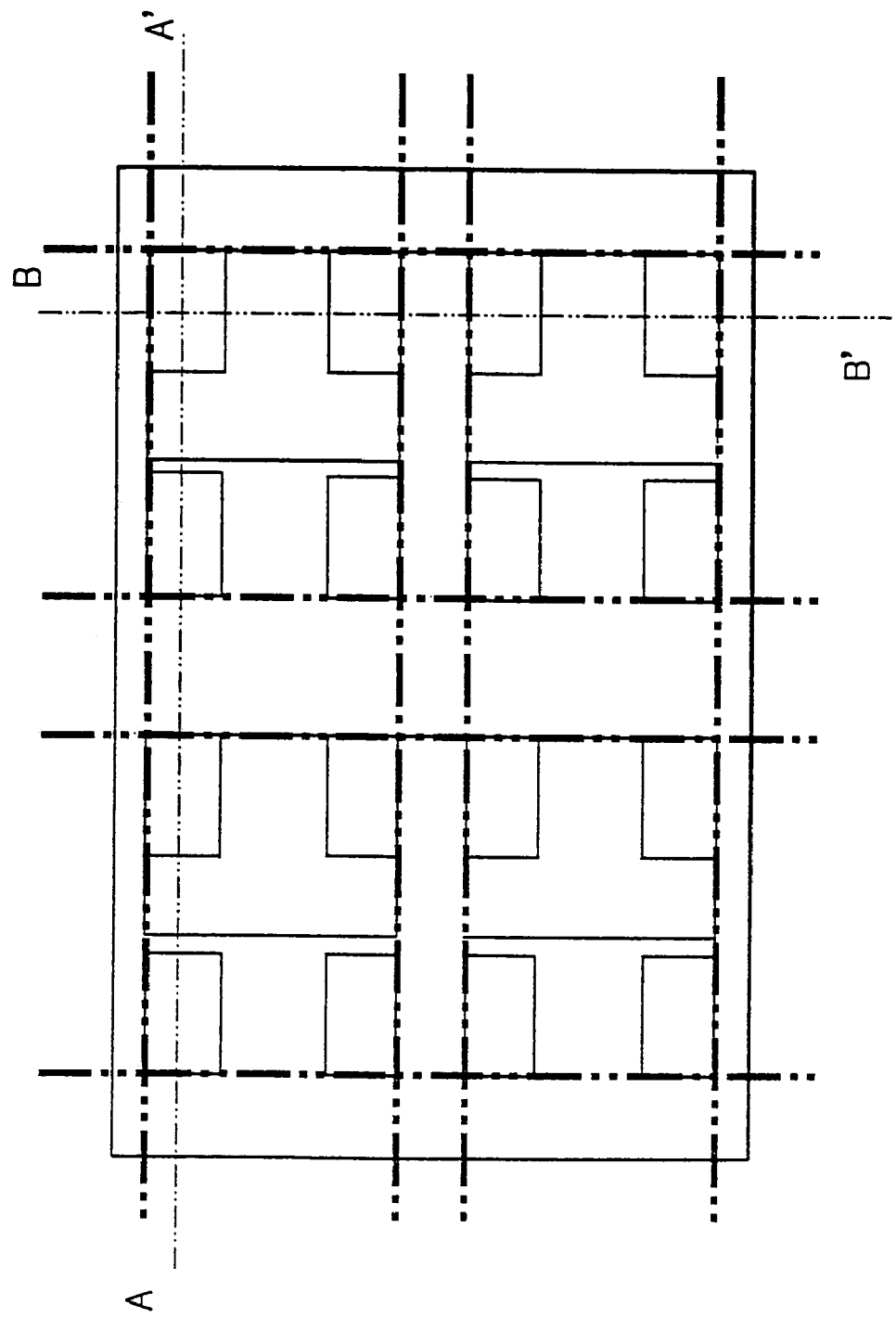

After the plating step, the package is again subjected to half-cut dicing over its regions indicated by bold dash-and-dots lines in FIG. 10A. More specifically, the base portions 11 formed with the electrodes 12 and the base portions 11 formed with both of the electrodes 12 and island portions 13 (tie portions) are diced by half-cut dicing. As a result, the seal resin 3 appears on the bottom of the package in accordance with the regions where the electrode portions 12 are present. In this manner, the procedure of the present invention forms the projections of the lead frame 1, which are expected to appear on the side of the package, on the bottom of the package. This allows etching to be effected in the same direction for forming external electrodes and for removing the above projections.

Figure 10B:
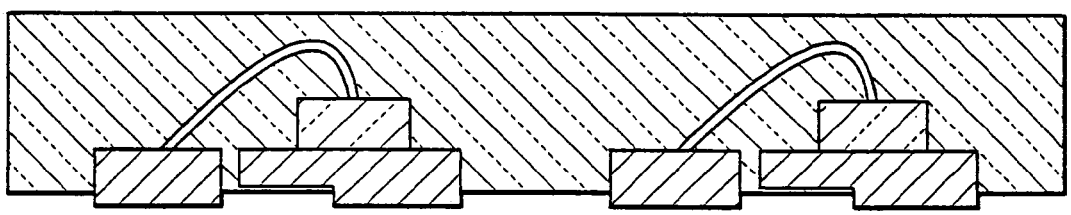
Figure 10C:
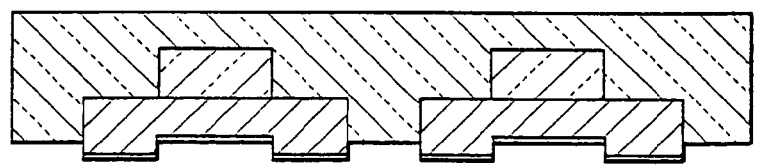

FIGS. 10B and 10C are sections along lines A–A' and B–B', respectively, of FIG. 10A. As shown, the procedure described above can form external electrodes 4 on the bottom of the package without the fear of the lead frame 1 appearing on the side of the package. This is because the projections of the base portions 11, which are to be cut in accordance with the configuration of the electrode portions 12, are formed before the formation of the external electrodes 4.

Figure 11A:
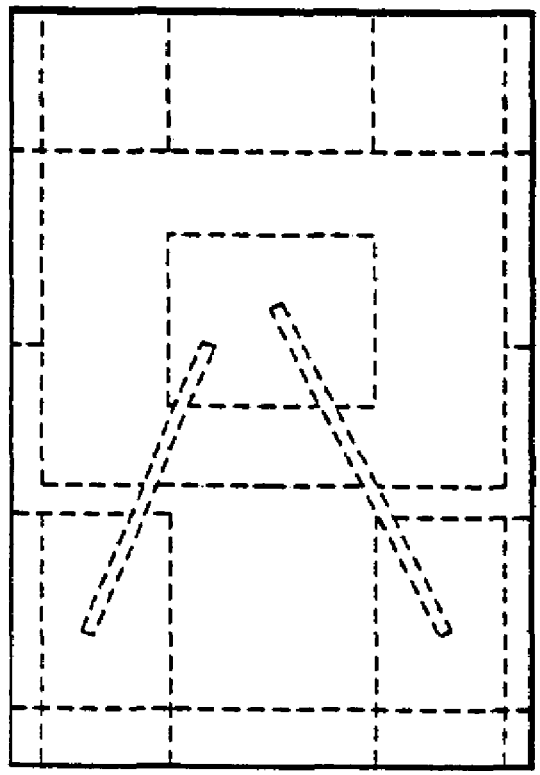
Figure 11A:
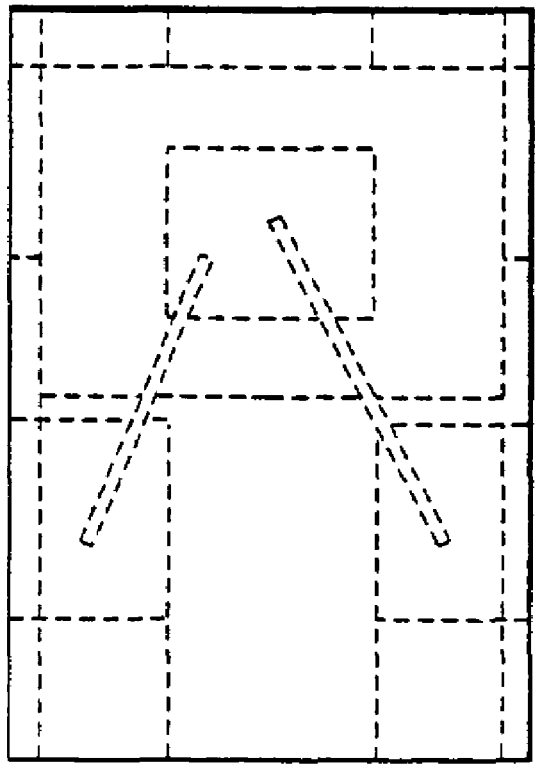
Figure 11B:
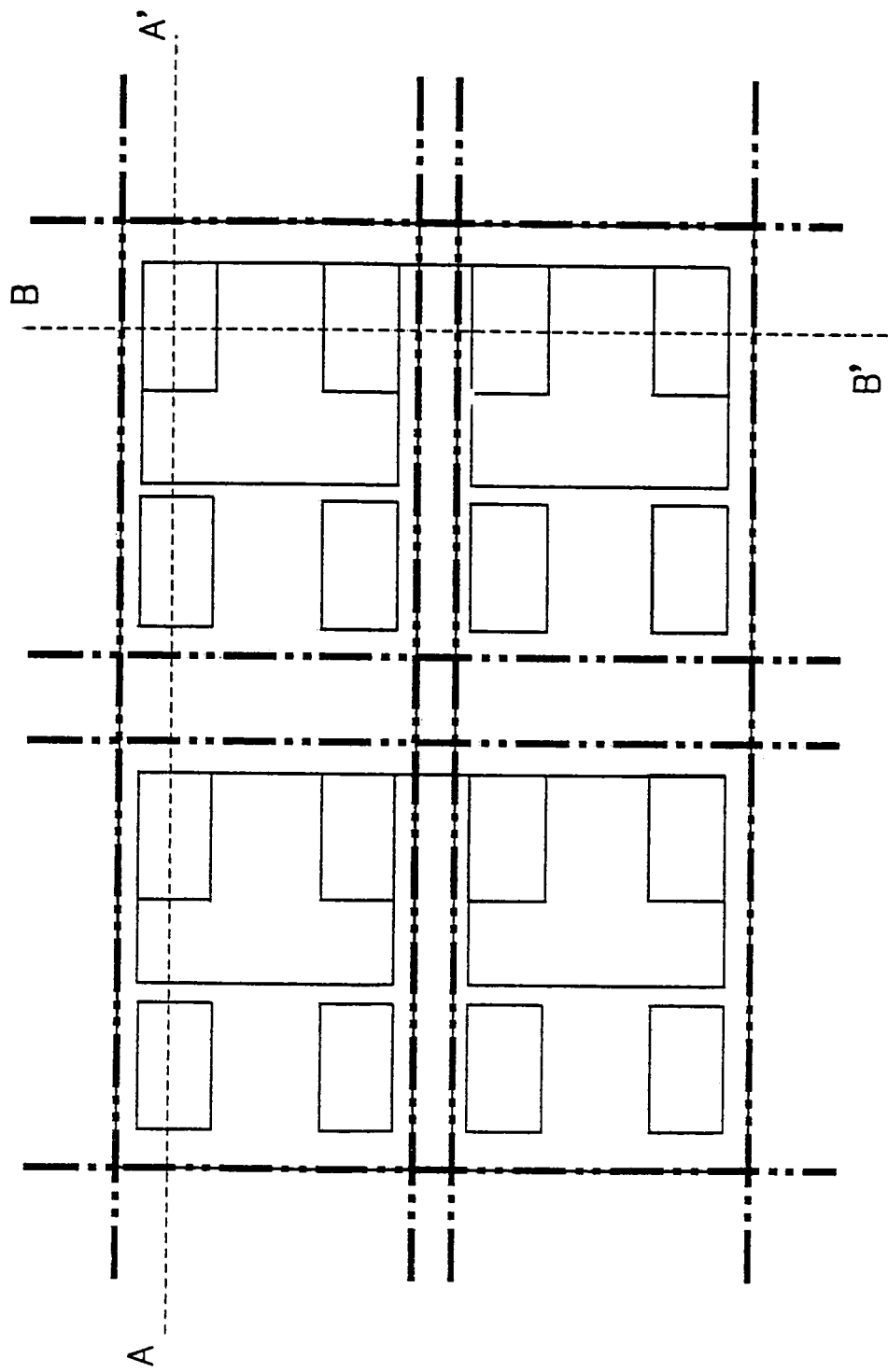

Finally, as shown in FIGS. 11A through 11D, the seal resin 3 is cut by full-cut dicing to thereby produce semiconductor devices 5. FIG. 11B is a bottom view showing regions to be cut by full-cut dicing, i.e., regions surrounded by bold dash-and-dots lines. FIG. 11A is a top view showing the diced parts of the package. FIGS. 11B wand 11C are sections along lines A–A' and B–B', respectively, of FIG. 11A.

Figure 11C:
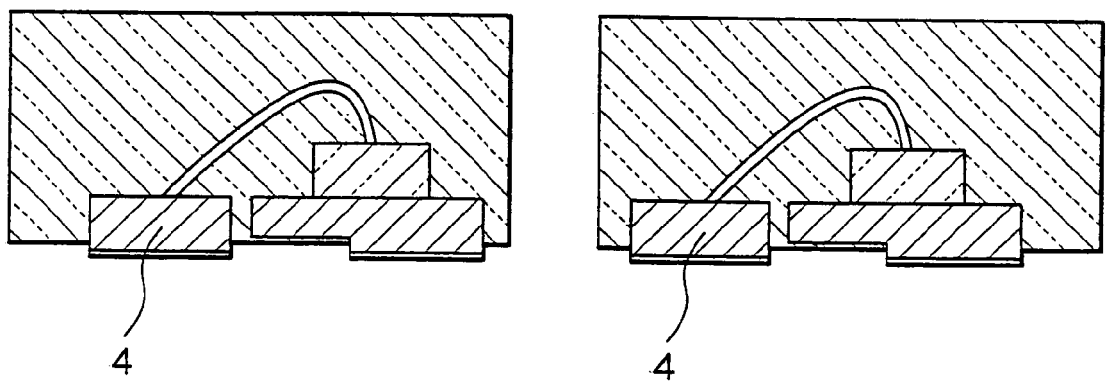
Figure 11D:
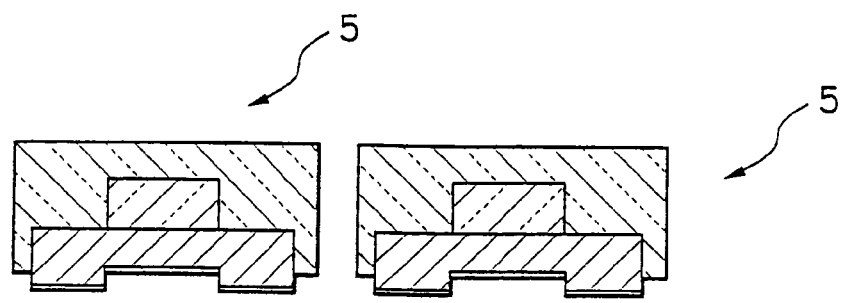

As FIGS. 11C and 11D indicate, the procedure described above provides the portions where only the seal resin 3 is present with margins, compared the portions where the external electrodes 4 are present. It is therefore possible to provide the package with any desired size on the basis of, e.g., the full-cut dicing positions. If the full-cut dicing width of the seal resin 3 is smaller than the half-cut dicing width of the lead frame 1, then part of the lead frame 1 can appear on the side of the resulting semiconductor device; if the former width is the same as the latter width, then part of the lead frame 1 can appear on the side of the semiconductor device.

Grinding, half-cut dicing, half-cutting and similar cutting technologies shown and described may be replaced with each other in matching relation to a desired semiconductor device.

In summary, it will be seen that the present invention provides a lead frame, a semiconductor device using the same and a method of producing the semiconductor device having various unprecedented advantages, as enumerated below.

(1) Etching applied to the bottom of a lead frame for forming external electrodes can be used to prevent the lead frame from appearing on the side of a semiconductor device. This obviates the need for an expensive resin sheet heretofore used to protect external electrodes and thereby noticeably reduces the production cost.

(2) The lead frame does not partly protrude from the side of a package. This reduces the distance between nearby semiconductor devices for thereby promoting dense mounting.

(3) Electrode portions and island portions are molded integrally with base portions. The lead frame is therefore provided with strength great enough to withstand half-cut dicing, grinding or similar processing. Half-cut dicing refers to setting a preselected depth and then cutting the lead frame or grinding seal resin, e.g., sealing the entire lead frame with seal resin and then grinding the bottom of the seal resin to form a standoff between exposed external electrodes. Full-cut dicing refers to cutting the seal resin.

(4) The base portions each consist of a portion on which the electrode portion are formed, a portion on which an island portion is formed, and a portion connecting them together. Such connecting portions insure a positional relation between the bottoms of the electrode portions and those of the island portions.

(5) The external electrodes formed by cutting or grinding also obviate the need for an expensive resin sheet and therefore reduce the production cost.

(6) Not only semiconductor devices can be densely arranged on a circuit board, but a standoff can be freely selected on the basis of half-cutting width.

(7). Plating is applied to the base portions after half-cut dicing and therefore applied only to the surfaces of the external electrodes.

Various modifications will become possible for those skilled in the art after receiving the teachings of the present disclosure without departing from the scope thereof.

What is claimed is:

1. A method of producing a semiconductor device for causing a surface of a lead frame to partly appear on a bottom of said semiconductor device, said method comprising the steps of:

forming a lead frame having a base portion with a substantially flat bottom;

forming an island portion and an electrode portion on top of said base portion;

mounting a semiconductor chip to said island portion;

connecting electrodes formed on a surface of said semiconductor chip and said electrode portion with bonding wires;

sealing part of a top and part of a bottom of said lead frame, which include said island portion, base said semiconductor chip, said electrode portion and said bonding wire, with seal resin;

grinding an entire surface of said seal resin beneath said lead frame in parallel to the bottom of said lead frame; and causing part of the bottom of said base to appear on a bottom of said seal resin.

2. The method as claimed in claim 1, wherein said lead frame comprises:

a pair of base portions each having a substantially flat bottom;

a pair of electrode portions each being at least partly integrally formed with a top of one of said pair of base portions; and said island portion at least partly integrally formed with tops of said pair of base portions, connecting said tops to each other.

3. A method of producing a semiconductor device for causing a surface of a lead frame to partly appear on a bottom of said semiconductor device, said method comprising the steps of:

mounting a semiconductor chip to an island portion included in said lead frame;

connecting electrodes formed on a surface of said semiconductor chip and an electrode portion with bonding wires;

sealing part of a top and part of a bottom of said lead frame, which include said island portion, said semiconductor chip, said electrode portion and said bonding wire, with seal resin;

grinding an entire surface of said seal resin beneath said lead frame in parallel to the bottom of said lead frame;

causing part of the bottom of said lead frame to appear on a bottom of said seal resin;

half-cut dicing a bottom of said island portion;

plating the bottom of said lead frame and the bottom of said island portion appeared on a bottom of said semiconductor device; and cutting a connecting portion, which forms part of a base portion of said lead frame, by half-cut dicing.

4. The method as claimed in claim 3, wherein said lead frame comprises:

said base portion having a substantially flat bottom, and said island portion and said electrode portion partly formed integrally with a top of said base portion.

5. The method as claimed in claim 3, wherein said lead frame comprises:

a pair of base portions each having a substantially flat bottom;

a pair of electrode portions each being at least partly integrally formed with a top of one of said pair of base portions; and said island portion at least partly integrally formed with tops of said pair of base portions, connecting said tops to each other.

* * * * *